US006958944B1

(12) United States Patent
Chou

(10) Patent No.: US 6,958,944 B1
(45) Date of Patent: Oct. 25, 2005

(54) ENHANCED REFRESH CIRCUIT AND METHOD FOR REDUCTION OF DRAM REFRESH CYCLES

(75) Inventor: Chung-Cheng Chou, Hsin-Chu (TW)

(73) Assignee: Taiwan Semiconductor Manufacturing Co., Ltd., (TW)

( * ) Notice: Subject to any disclaimer, the term of this patent is extended or adjusted under 35 U.S.C. 154(b) by 0 days.

(21) Appl. No.: 10/854,051

(22) Filed: May 26, 2004

(51) Int. Cl.[7] .................................................. G11C 8/00
(52) U.S. Cl. .................................. 365/222; 365/230.03
(58) Field of Search ............................ 365/222, 230.03

(56) References Cited

U.S. PATENT DOCUMENTS

| | | | | |
|---|---|---|---|---|
| 5,522,064 | A * | 5/1996 | Aldereguia et al. | 365/222 |
| 5,835,436 | A * | 11/1998 | Ooishi | 365/222 |
| 5,914,902 | A * | 6/1999 | Lawrence et al. | 365/222 |
| 6,118,719 | A * | 9/2000 | Dell et al. | 365/222 |
| 6,233,193 | B1 * | 5/2001 | Holland et al. | 365/222 |
| 6,317,657 | B1 * | 11/2001 | George | 365/222 |
| 6,463,001 | B1 * | 10/2002 | Williams | 365/222 |
| 6,707,745 | B2 * | 3/2004 | Mizugaki | 365/222 |
| 6,711,081 | B1 * | 3/2004 | Jain | 365/222 |
| 6,779,136 | B2 * | 8/2004 | Richter et al. | 365/222 |

* cited by examiner

*Primary Examiner*—Trong Phan
(74) *Attorney, Agent, or Firm*—Duane Morris LLP

(57) ABSTRACT

A method and circuits are disclosed for refreshing a memory module. After receiving a refresh address identifying a word line to be refreshed, the refresh address is located in one of a predetermined number of memory blocks of the memory module that is monitored. It is further determined whether the word line has been accessed while the memory block is being monitored. If it is determined that the word line has not been accessed, the word line is refreshed. If it is determined that the word line has been accessed, the refreshing operation is skipped for that word line.

20 Claims, 5 Drawing Sheets

ENHANCED REFRESH CIRCUIT AND METHOD FOR REDUCTION OF DRAM REFRESH CYCLES

BACKGROUND

The present invention relates generally to semiconductor devices, and more particularly to semiconductor memory devices.

In certain dynamic random access memories (DRAMs), it is necessary for the information stored in the memory cells to be periodically refreshed, since the memory cells can retain the information stored in them for only a limited time. The reason for this is that capacitors are used as memory cells for DRAMs. These capacitors discharge themselves after a specific time, as a result of unavoidable internal quiescent currents, so that the stored charges of the capacitors have to be regularly renewed. The period of time in which the memory cells hold their stored charge is known as its data retention time. The memory cells are, therefore, recharged at fixed predetermined time intervals, so-called refresh cycles. The pulse for recharging, the so-called refresh pulse, can be generated internally within the module, or else externally. In modern DRAMs, refresh cycles of at least 4096 refresh operations per 64 ms (refresh rate 6 k/64 ms) are customary.

The refresh cycle for the DRAM, e.g. the interval between the individual refresh pulses, must be chosen such that even the memory cell with the shortest retention time, which specifies how long the memory content can be retained in the associated cell, is refreshed again in due time. The conventional refresh method in the case of DRAMs, therefore, has the consequence that even memory cells with longer retention times are refreshed again prematurely. This leads to an unnecessarily high current consumption in the DRAM, and shortens, in particular, the operating duration of accumulator- or battery-operated computers having such DRAMs. Since the normal writing and reading operations of the DRAM are interrupted during the refresh operation, e.g., by the presence of a so-called wait command, at the processor, which controls the DRAM, the availability of the DRAM is also reduced by the short refresh cycles required for the memory cells.

Desirable in the art of semiconductor memory design are improved memory refresh methods and circuits with which better control of the power consumption may be achieved.

SUMMARY

In view of the foregoing, this invention provides a circuit and method to improve memory performance through the incorporation of a refresh control module.

In one embodiment, after receiving a refresh address identifying a word line to be refreshed, the refresh address is located in one of a predetermined number of memory blocks of the memory module that is monitored. It is further determined whether the word line has been accessed while the memory block is being monitored. If it is determined that the word line has not been accessed, the word line is refreshed. If it is determined that the word line has been accessed, the refreshing operation is skipped for that word line.

The construction and method of operation of the invention, however, together with additional objects and advantages thereof, will be best understood from the following description of specific embodiments when read in connection with the accompanying drawings.

DESCRIPTION

The following provides a circuit and method for using a refresh control module to reduce the number of memory cell refresh operations. Although the invention is illustrated and described herein, as embodied in a circuit and method for refreshing memory cells, in a DRAM device below, it is nevertheless not intended to be limited to the details shown, since various modifications and structural changes may be made to various memory devices, and the invention can be applied to any memory device that needs to refresh itself to maintain the data.

Figure 1:
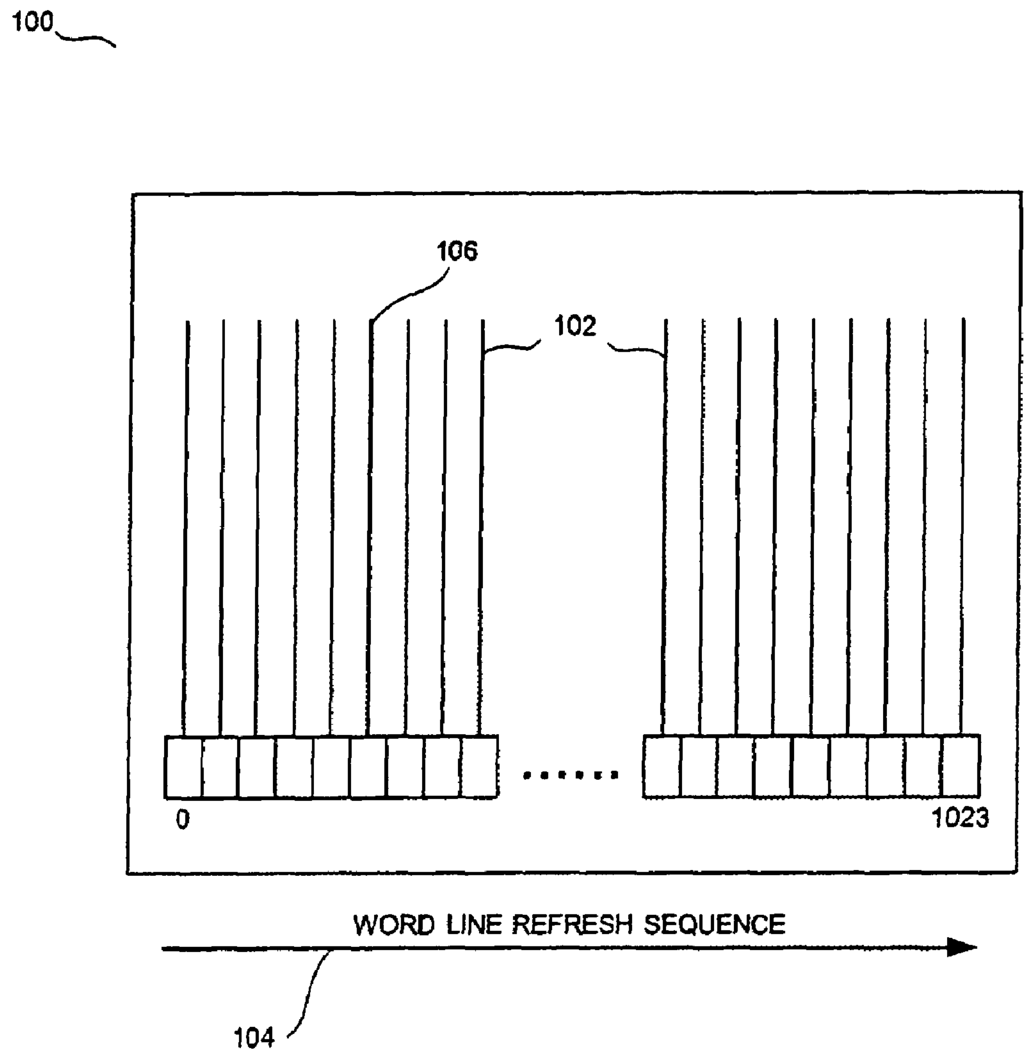
FIG. 1 illustrates a conventional DRAM word line refresh sequence diagram.

FIG. 1 illustrates a conventional DRAM word line refresh sequence diagram 100. A typical DRAM has both word lines (ROWs) and bit lines (COLUMNs) organized in a matrix structure. The number of rows and columns dictate the DRAM memory size. In this example, the diagram 100 illustrates a DRAM memory module with 1024 word lines 102 (ROWs). This diagram 100 further illustrates the sequence of refresh actions on each word line 102, from the word line 0 to the last word line 1023. An arrow 104 indicates the fixed direction for stepping through the word lines in the refresh cycle within the DRAM module. For example, a word line 106, which is in bold, is presently being refreshed in FIG. 1. It is noted that all word lines will be refreshed sequentially, whether or not the cells actually require a refreshing operation.

Figure 2A:
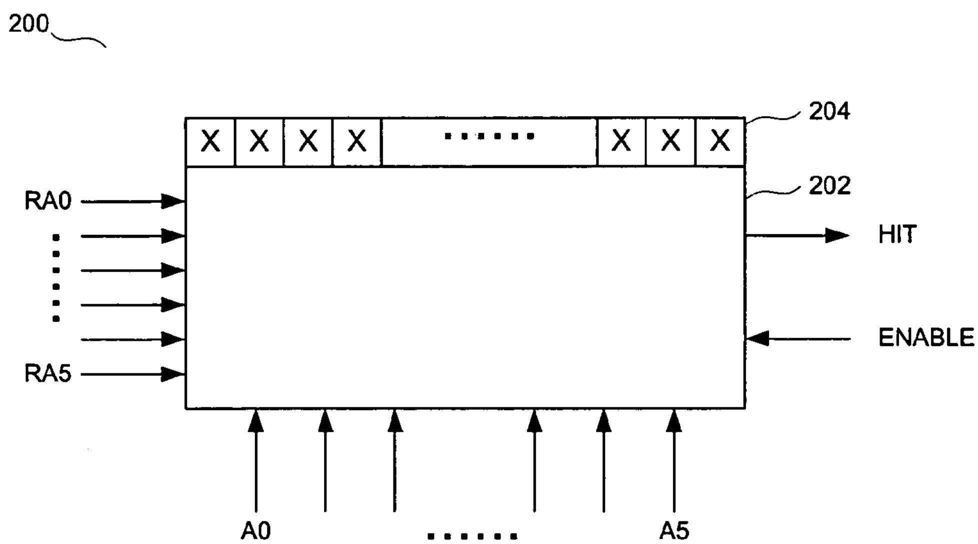
FIG. 2A illustrates a refresh control module, in accordance with one embodiment of the present invention.

FIG. 2A illustrates a refresh control module 200 that is comprised of an evaluation module 202, and a set of flag status modules 204, in accordance with one embodiment of the present invention. An enhanced refresh DRAM contains a refresh control module 200 that monitors a subset of the total DRAM word lines at any one time. In this example, there are a total of 1024 DRAM word lines. Also in this example, there are 16 monitoring windows, or memory blocks, with each containing 64 word lines (16×64=1024). Therefore, the refresh control module 200 monitors 64 word lines, in each virtual monitoring window, or memory block, that are accessed sequentially (in this example, block 0, 1, 2 . . . 16). The evaluation module 202 is shown with input and output signals, and it is basically a comparison circuit, in this example of where each monitoring window monitors 64 word lines. The evaluation module 202 evaluates each window of 64 word lines sequentially from 0 through 63 and then resets itself to 0 again for the next window. There is a set of status flags modules 204, shown as X's, for each of the word lines of the evaluation module 202. In this example, there are 64 status flag modules 204 to indicate the access status of the 64 word lines within the evaluation module 202. The evaluation module 202 utilizes a virtual monitoring window representing a subset of the memory module to select a small group (64 word lines) out of the total 1024 word lines for refresh instead of the conventional DRAM operation of sequencing line by line through the entire module of word lines 0 to 1023. All of the DRAM word lines are sequentially refreshed according to a refresh address pointer using address lines RA0–RA9. The most significant bits (MSB) RA6–RA9, of the refresh address pointer (or the MSB A6–A9), are utilized for the selection of one of the 16 windows. The least significant bits (LSB) RA0–RA5, of the refresh address pointer are utilized for the selection of the 64 word lines, in the current monitoring window. The memory access or read/write (R/W) access cycle utilizes the access address lines A0–A9 for read/write access of each word line.

Since the 1024 word lines are divided into 16 memory blocks, each block contains 64 word lines (16×64=1024). The 64 word lines, in each of the 16 virtual monitoring windows, or memory blocks, are still accessed by the access address lines A0–A5, during the R/W access cycle, and by refresh addresses RA0–RA5, during the refresh cycle. Only one of the 16 virtual monitoring windows, or memory blocks, is monitored closely at any moment during the refresh cycle. This virtual monitored window moves from the beginning to the end of the 64 word lines contained within the monitored window sequentially (WL0 through WL64).

The status flag modules 204 are used to indicate whether the associated word line has been accessed by a read or write operation while the refresh cycle is going through the monitored memory block. Word lines are recharged whenever a read or write command is applied to that word line. The word line status flag may be set to a "0" if that word line has not been recharged while the memory block it belongs to is being monitored, thereby indicating that the word line needs to be refreshed. When that word line has been recently recharged at the time the memory block is monitored, the word line status flag is set to a "1," thereby indicating that the refresh operation can skip this particular word line.

The HIT output signal indicates a "hit" (high) when the refresh control module 200 reaches a word line that has its corresponding status flag set to a "1". In this example, there are 64 bits of status flags since there are 64 word lines in a memory block. In order to determine whether a hit is there, the access addresses are stored by a simple storage latch circuit (shown in FIG. 4), and compared with the refresh addresses bit by bit to assure that the word line has, indeed, been accessed.

Figure 3A:
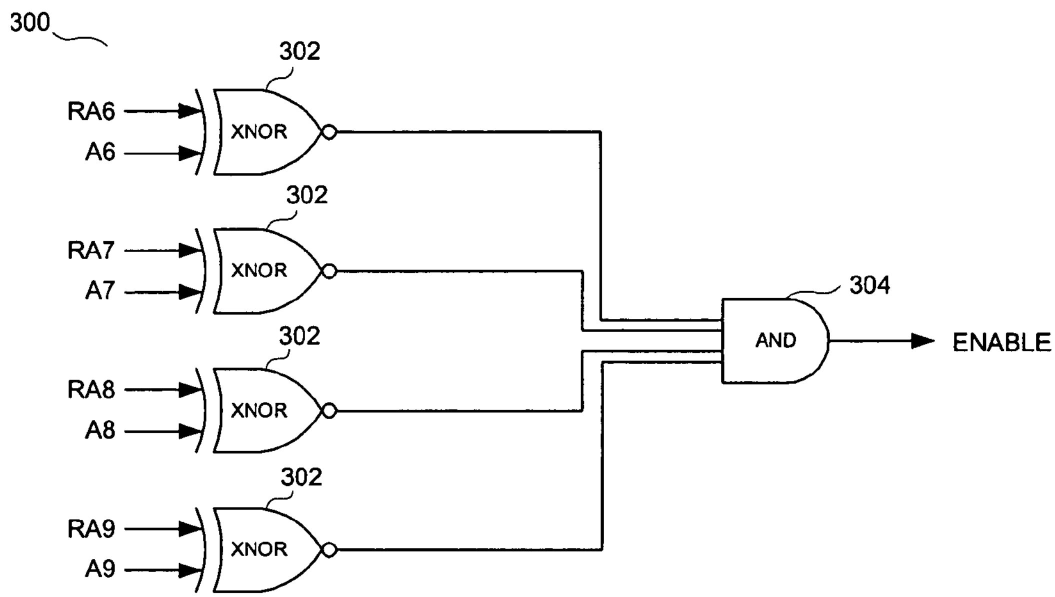
FIG. 3A illustrates an enhanced memory block location module, in accordance with one embodiment of the present invention.

The input signal "ENABLE" is generated by the enhanced memory block location module 300, as shown in FIG. 3A. This signal is normally held at a low state, but transitions to a high state only when the current access word line WL address, as determined by A6 to A9, is located in the current virtual window as determined by RA6 to RA9. The RST_signal is an active low signal that is used to reset all the status flags to a 0 at the end of each memory block refresh cycle.

Figure 2B:
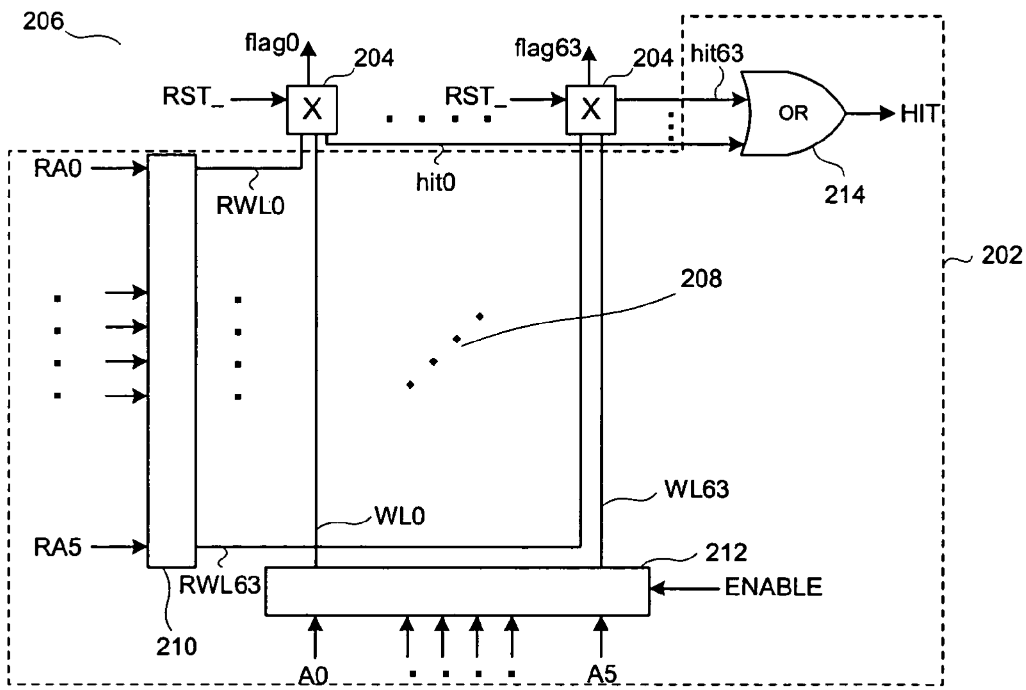
FIG. 2B illustrates the circuitry of the refresh control module, in accordance with one embodiment of the present invention.

FIG. 2B illustrates a circuit diagram 206 of the refresh control module 200, in accordance with one embodiment of the present invention. The refresh control module circuit 206 is composed of the evaluation module 202, and the set of 64 status flag modules 204. The evaluation module 202 is comprised of the memory block 208, the refresh address decoder 210, the access address decoder 212, and the "OR" gate 214. The memory block 208 represents the 64 word lines of this virtual memory block. The refresh address decoder 210, and the access address decoder 212 decodes/selects the required refresh word lines RWL0–RWL63, and the access word lines WL0–WL63, as determined by the address lines RA0–RA5 and A0–A5, respectively. The refresh signal RWLi (where i=0 to 63, RWL0 to RWL63), and the access signal WLi (where i=0 to 63, WL0 to WL63) are input to its corresponding flag circuit module 204 (flag0–flag63). When the WL access signal such as WL0 is selected for access, the flag circuit 204 for flag0 goes high (WL0=1). If the refresh row pointer is high (RWL0=1), indicating that this virtual window is active, then the signal "hit0" is generated (hit0=1). The OR gate 214 generates a high or 1 output whenever any of the 64 word lines have been accessed during the current window as indicated by setting the HIT signal high. The refresh address lines RA0–RA9 comprise a pointer (set of latches in decoder 210) to point to the address of the word line to be refreshed. The pointer address will be updated, at regular periods, as determined by the system clock. In this example, it is assumed that the pointer address will be updated every 100 clock cycles, that there are 16 memory blocks or virtual windows, as defined by the four most significant bits (MSBs), and that there are 64 WLs in each memory block. Each memory block, or virtual window, will be "open" for 6400 clock cycles (64 WLs×100 clock cycles). During this "open" virtual window, any WL that is accessed for a read or write operation will have its corresponding status flag set to a 1 or high condition and its associated HIT signal (HIT0–HIT63) indicating that this word line can be skipped until the refresh pointer scans that particular WL again.

FIG. 3A illustrates the enhanced memory block location circuit 300. The four most significant bits of the refresh address, and the access address, are compared in this circuit. By selecting four bits in this circuit, it is determined that there are 24 or 16 virtual windows, or memory blocks, that the memory module is divided into. Other numbers of bits can be chosen so that the number of memory blocks are increased or decreased. Correspondingly, the number of bits left for the refresh control module 200 to use will be respectively decreased or increased. This circuit generates an ENABLE signal only when the word line WL being accessed is located within the current memory block. The refresh address pointer (RA0–RA9) counts sequentially from WL 0 to Word line 1023; therefore, RA6 thru RA9 signify the 16 memory blocks and are counted sequentially also. The word line WL being accessed is located within the current memory block when the 4 MSBs (A6–A9), of the access address (A0–A9), are the same as the 4 MSBs (RA6–RA9), of the refresh address pointer (RA0–RA9). The exclusive NOR gate 302 for RA6 and A6 compares the state of each input and generates a high output when both inputs are either both high or both low. The same operation occurs for RA7-A7, RA8-A8, and RA9-A9. Thus, when all bits of RA6 thru RA9 are the same as A6 thru A9, all outputs of the 4 XNOR gates 302 will be high. This will cause the AND gate 304 output ENABLE to go high indicating that the access address WL is within the current memory block. This condition will enable the access address decoder 212 (FIG. 2B), select the proper WL, and generate the signal WLi (where i=0 to 63) to set its status flag high. This circuit is shown in FIG. 4.

Figure 3B:
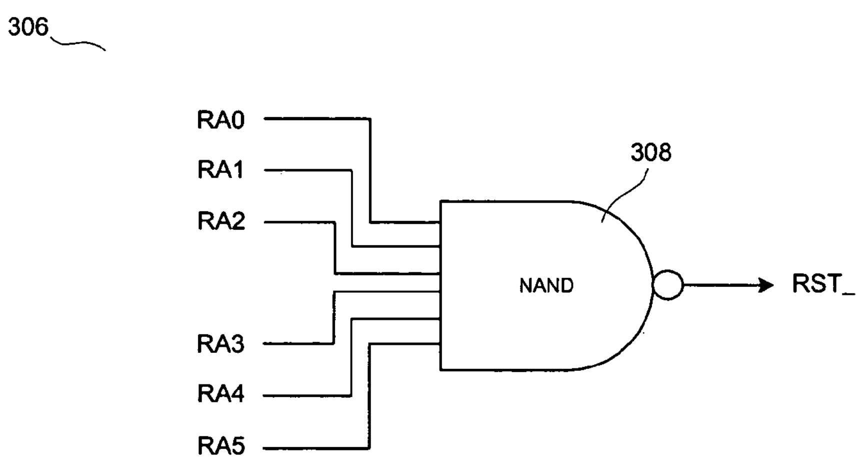
FIG. 3B illustrates a flag reset circuit, in accordance with one embodiment of the present invention.

FIG. 3B illustrates the flag reset circuit 306. RA0–RA5 represent the least significant bits (LSB) of the refresh address pointer (RA0–RA9). The refresh address pointer will count sequentially from WL 0 to WL1023. RA0–RA5 will count sequentially from word line 0 to word line 63, in each of the 16 memory blocks, or virtual windows. The RST_will remain in the high state until RA0 to RA5 are all 1s, indicating that this is the last word line in this window. The NAND gate 308 output RST_goes low with all inputs high to start the transition to the next memory block. The low on the RST_line then resets all status flags. The RST_line goes back high when the RA0–RA5 inputs restart counting at WL0.

Figure 4:
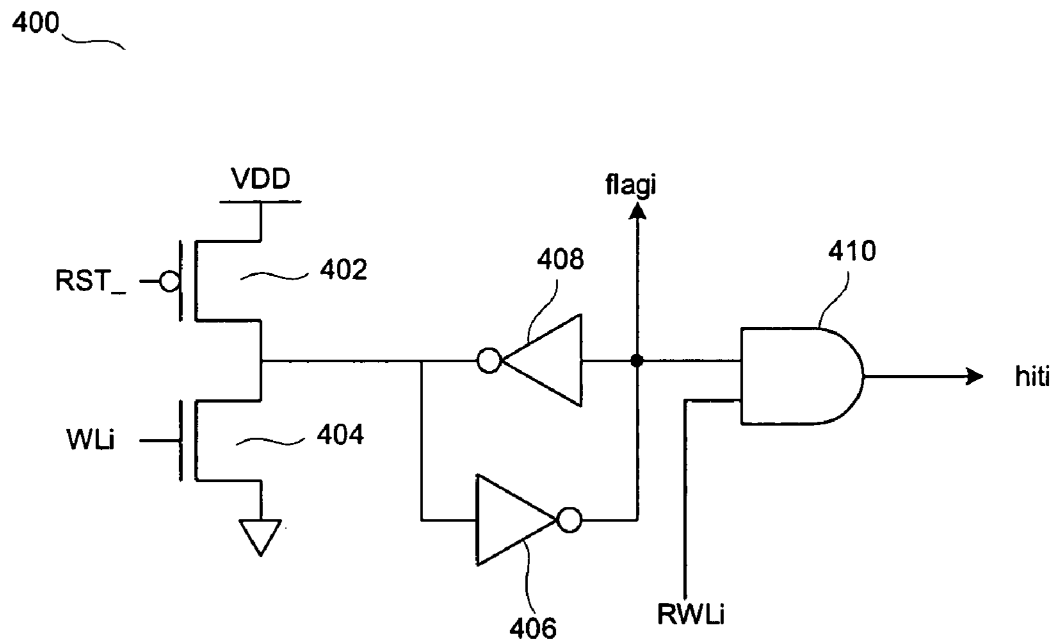
FIG. 4 illustrates a flag indicator circuit, in accordance with one embodiment of the present invention.

FIG. 4 illustrates the flag indicator circuit 400 contained within the flag status module 204. The active low RST_signal enables transistor 402, and applies a high to the input of inverter 406 causing its output to go low. The low of the inverter 406 output causes the inverter 408 output to latch the inverter 406 logic state, and also resets the status flags flagi (where i=0,63) to a low state. The AND gate 408 output signal "hiti" remains in a low state until both AND gate inputs (flagi and RWLi) are high.

When the access address WL is within the current memory block, the ENABLE signal generated in circuit 300 goes high. The high ENABLE signal generates a high WLi (where i=0,63) signal that is sent to its respective flag module 204, as shown in 206. The high WLi signal is applied to the flag circuit 400 causing transistor 404 to turn on. This pulls the inverter 406 input low and its output high while inverter 408 latches this condition. The high, on the inverter 406 output, sets the flag signal flagi high to indicate that an access to that WL has occurred. When a refresh command RWLi for that WL is generated (RWLi=high), and the flagi signal for that WL is high, the AND gate 410 output signal hiti also goes high. The high hiti signal is inputted to the OR gate 214 (FIG. 2B) which generates the HIT signal indicating that the refresh cycle for that WL can be skipped.

Figure 5:
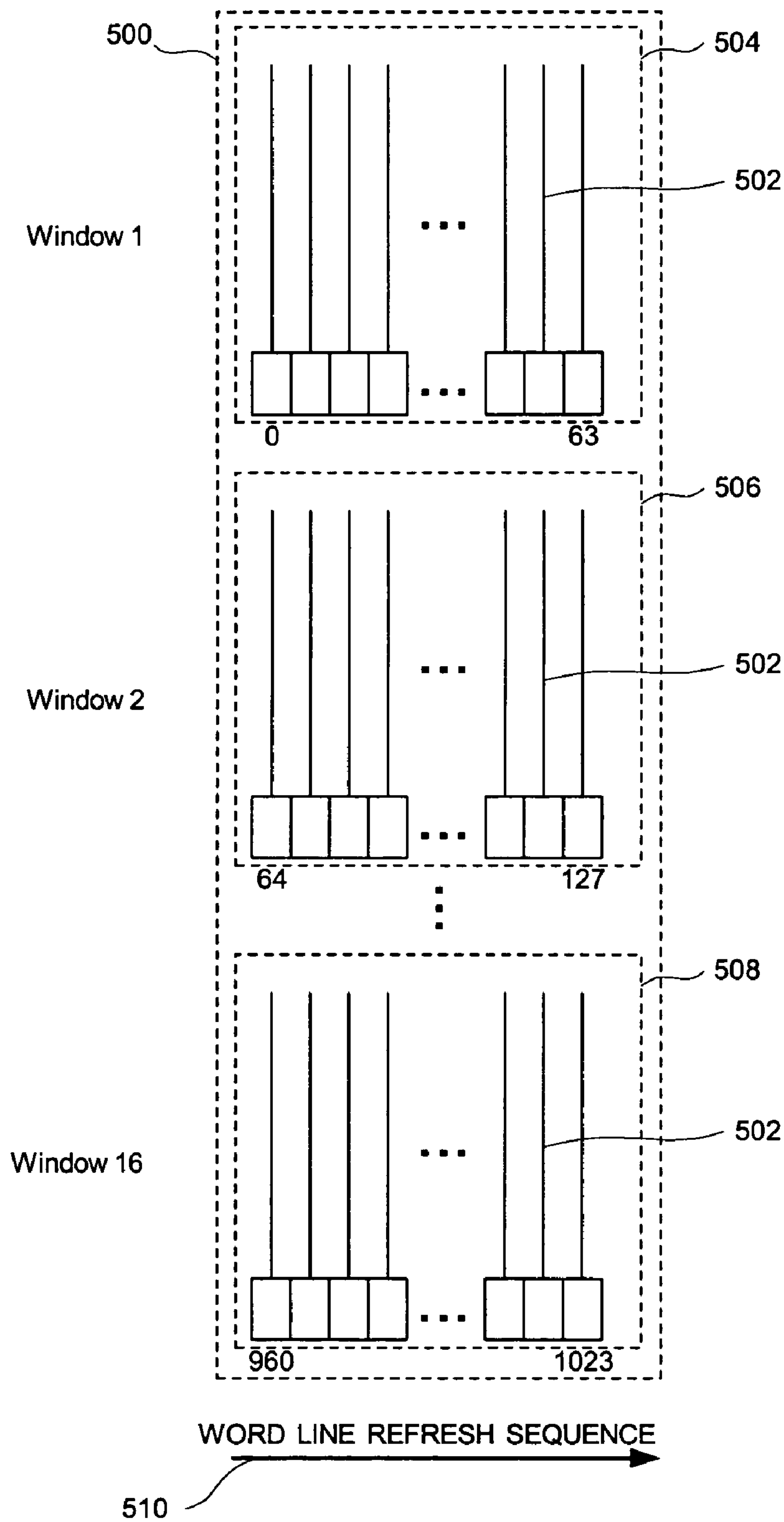
FIG. 5 illustrates a word line refresh sequence diagram using memory blocks, in accordance with one embodiment of the present invention.

FIG. 5 illustrates conducting a refresh operation through a memory module 500 in accordance with one embodiment of the present invention. In this example, the memory module 500 has 1024 word lines 502 (ROWs). This memory module is divided into 16 groups of memory blocks, each having 64 word lines.

This diagram also illustrates the sequence of the refresh actions on the word lines 502 from word line 0 to the last word line 1023. The dashed line box 504, 506 and 508 represents memory blocks 1, 2, and 16, respectively, with 64 word lines contained therein for each. An arrow 510 illustrates the fixed sequence of stepping through the word lines in each of the 16 windows within the memory module. When a HIT signal is generated by the refresh control module, indicating that the word line selected has recently been accessed by a read or write operation to that word line, the refresh operation then bypasses that word line.

With longer DRAM data retention time, there is an increased possibility of hitting the recently accessed word lines during the refresh cycle, thereby increasing the DRAM performance. When a refresh operation is conducted, the memory device will halt all read or write operation to wait for the refresh operation to be completed. By using the method and circuits described above, a recently accessed word line will skip its refresh operation, thus greatly increasing the efficiency of the memory device. Therefore, the enhanced refresh DRAM device, as described above, has a major performance increase to allow additional R/W cycles. This would allow for additional R/W cycles, faster memory performance, and less stand-by power consumption, which are all critical in today's portable electronic devices such as laptops, palms, etc.

The above invention provides many different embodiments, or examples for implementing different features of the invention. Specific examples of components and processes are described to help clarify the invention. These are, of course, merely examples, and are not intended to limit the invention from that described in the claims.

Although the invention is illustrated and described herein as embodied in a design and methodology for refreshing memory modules, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for refreshing a memory module comprising:

receiving a refresh address identifying a word line to be refreshed;

locating the refresh address in one of a predetermined number of memory blocks of the memory module that is monitored;

determining whether the word line has been accessed while the memory block is being monitored; and refreshing the word line if it is determined that the word line has not been accessed, while skipping the refreshing if it is determined that the word line has been accessed.

2. The method of claim 1 further comprising dividing the memory module into the predetermined number of blocks based on a total number of bits available for an access address.

3. The method of claim 2 wherein the memory module is divided into memory blocks identifiable by a first number of bits with each block having a plurality of word lines identifiable by a second number of bits, wherein the sum of the first and second number of bits equals the total number of bits provided by the access address.

4. The method of claim 3 wherein the locating further includes determining the memory blocks by comparing the first number of bits, of the access address, with a corresponding number of bits, of the refresh address.

5. The method of claim 4 wherein the first number of bits are the most significant bits of the access address, and the corresponding number of bits of the refresh address are also the most significant bits thereof.

6. The method of claim 1 wherein the determining further includes monitoring whether each word line has been charged.

7. The method of claim 6 wherein the monitoring further includes using a status flag to represent whether a word line has been accessed.

8. The method of claim 1 further comprising storing an access address when the word line is accessed for later comparing with the refresh address.

9. A circuit for refreshing a memory module comprising:

a memory block location module for receiving a refresh address identifying a word line to be refreshed and for locating the refresh address in one of a predetermined number of memory blocks of the memory module; and an evaluation module for determining whether the word line has been accessed during a time period in which the located memory block is monitored, wherein the word line is refreshed if it is determined that it has not been accessed, while skipping the refreshing if it is determined that the word line has been accessed during the time period.

10. The circuit of claim 9 wherein the memory module is divided into the predetermined number of blocks based on a total number of bits available for the refresh address of the memory module.

11. The circuit of claim 10 wherein the memory module is divided into memory blocks identifiable by a first number of most significant bits, with each block having a plurality of word lines identifiable by a second number of bits, wherein the first and second number of bits make up the refresh address.

12. The circuit of claim 11 wherein the memory block location module further includes means for comparing the first number of bits of the refresh address with a corresponding number of bits of an access address.

13. The circuit of claim 11 wherein the second number of bits are the least significant bits of the refresh address.

14. The circuit of claim 9 wherein the evaluation module further includes at least one status flag associated with a word line for monitoring whether the word line has been accessed.

15. The circuit of claim 9 further comprising a storage module for storing one or more access addresses when a word line is accessed.

16. A method for refreshing a memory module comprising:

dividing the memory module into one or more memory blocks;

monitoring the memory blocks sequentially during a refresh operation of the memory module, wherein while conducing the refresh operation:

receiving a refresh address identifying a word line in a monitored memory block to be refreshed;

determining whether the word line has been accessed while the memory block is being monitored; and refreshing the word line if it is determined that the word line has not been accessed, while skipping the refreshing, if it is determined that the word line has been accessed.

17. The method of claim 16 wherein the memory module is divided into memory blocks identifiable by a first number of most significant bits with each block having a plurality of word lines identifiable by a second number of bits, wherein the first and second number of bits make up the access address.

18. The method of claim 17 wherein the determining further includes determining whether word line of the access address is within the monitored memory block by comparing with the first number of most significant bits of the refresh address.

19. The method of claim 16 wherein the determining further includes monitoring whether each word line has been accessed using a status flag.

20. The method of claim 16 further comprising storing an access address when the word line is accessed for later comparing with the refresh address.

* * * * *